(12) United States Patent
Kadokura

(10) Patent No.: US 8,825,425 B2
(45) Date of Patent: Sep. 2, 2014

(54) CORRECTION METHOD OF GEOMAGNETIC SENSOR IN MOBILE DEVICE, MOBILE DEVICE, AND PROGRAM

(75) Inventor: Junichi Kadokura, Tokyo (JP)

(73) Assignee: NEC Corporation, Tokyo (JP)

(*) Notice: Subject to any disclaimer, the term of this patent is extended or adjusted under 35 U.S.C. 154(b) by 380 days.

(21) Appl. No.: 13/258,917

(22) PCT Filed: Apr. 26, 2010

(86) PCT No.: PCT/JP2010/057783
§ 371 (c)(1),
(2), (4) Date: Sep. 22, 2011

(87) PCT Pub. No.: WO2010/131599
PCT Pub. Date: Nov. 18, 2010

(65) Prior Publication Data
US 2012/0072155 A1    Mar. 22, 2012

(30) Foreign Application Priority Data

May 14, 2009    (JP) .................................. 2009-117214

(51) Int. Cl.
*G06F 19/00*    (2011.01)
*G01C 17/38*    (2006.01)
*G01R 33/00*    (2006.01)

(52) U.S. Cl.
CPC ............ *G01C 17/38* (2013.01); *G01R 33/0035* (2013.01); *H04M 2250/12* (2013.01)
USPC .............................. 702/92; 33/356; 702/150

(58) Field of Classification Search
CPC ........ G01C 17/38; G01C 21/14; G01C 21/20; G01R 33/0035; G01D 3/0365; H04M 2250/12; G06F 1/1626; G06F 1/1694; G06F 2200/1637

USPC .............. 702/92, 94, 95, 141, 150, 151, 158; 455/556.1; 701/409; 33/356

See application file for complete search history.

(56) References Cited

U.S. PATENT DOCUMENTS

| 7,210,236 B2 * | 5/2007 | Sato et al. ....................... 33/356 |
| 2010/0076720 A1 * | 3/2010 | Mori et al. ..................... 702/150 |

FOREIGN PATENT DOCUMENTS

| CN | 1501050 A | 6/2004 |
| CN | 1715834 A | 1/2006 |
| CN | 101023323 A | 8/2007 |
| EP | 1 605 232 A2 | 12/2005 |
| EP | 2 009 393 A1 | 12/2008 |
| JP | 2005207799 A | 8/2005 |

(Continued)

OTHER PUBLICATIONS

International Search Report for PCT/JP2010/057783 mailed Jul. 27, 2010.

(Continued)

*Primary Examiner* — John H Le
(74) *Attorney, Agent, or Firm* — Sughrue Mion, PLLC

(57) ABSTRACT

A mobile device has a geomagnetic sensor, a position detection device, such as an acceleration sensor, for detecting a position of the mobile device, or a direction of a mobile device and a form of the mobile device, and a controller operable to control the geomagnetic sensor and the position detection device. When the position detection device detects a predetermined position change, the controller starts a correction process of the geomagnetic sensor based upon the detection.

9 Claims, 3 Drawing Sheets

(56) References Cited

FOREIGN PATENT DOCUMENTS

| | | | |
|---|---|---|---|
| JP | 2005291934 A | 10/2005 |
| JP | 2005-345388 A | 12/2005 |
| JP | 2005-347843 A | 12/2005 |
| JP | 2006023293 A | 1/2006 |
| JP | 2007-181188 A | 7/2007 |
| JP | 2008035429 A | 2/2008 |

OTHER PUBLICATIONS

Japanese Office Action for JP Application No. 2011-513315 mailed on Nov. 6, 2013 with Partial English Translation.

Chinese Office Action for CN Application No. 201080021366.7 issued on Jun. 3, 2013 with English Translation.

The Extended European Search Report for EP Application No. 10774856.8 dated on Jul. 3, 2013.

\* cited by examiner

CORRECTION METHOD OF GEOMAGNETIC SENSOR IN MOBILE DEVICE, MOBILE DEVICE, AND PROGRAM

TECHNICAL FIELD

The present invention relates to a correction process of a geomagnetic sensor, called calibration, and more particularly to timing of performing a correction process of a geomagnetic sensor included in a mobile device such as a cellular phone.

BACKGROUND ART

Generally, a geomagnetic sensor is a device that detects very minute geomagnetism to identify a point of the compass. Therefore, a geomagnetic sensor is likely to be influenced by magnetism from peripheral magnetic sources. Thus, a geomagnetic sensor is likely to cause some deviation in detection depending upon the environment. In order to obtain an accurate measurement result, a correction process of a geomagnetic sensor, called calibration, should be performed in a proper manner.

In a case where a geomagnetic sensor is installed at a fixed position, even if a correction process is not so frequently performed, a measurement result can be obtained from a geomagnetic sensor with sufficient accuracy as long as the geomagnetic sensor keeps the same positional relationship with peripheral magnetic sources. However, since a mobile device such as a cellular phone has characteristics of a carried device, the environment where a geomagnetic sensor is used changes frequently. A mobile device including a geomagnetic sensor is described in JP-A 2005-207799 (hereinafter referred to as Patent Literature 1). In a case where a geomagnetic sensor is included in a mobile device, a measurement result cannot be obtained with sufficient accuracy unless a correction process is performed more frequently than a fixed type geomagnetic sensor because the presence of peripheral magnetic sources, the positional relationship, and the like are not kept constant.

Meanwhile, a certain period of time is required for a correction process of a geomagnetic sensor. In order to perform a correction process, a user conducts an operation of orienting a geomagnetic sensor of a mobile device preferably toward the north and rotating it around a specific axis a plurality of times. If a user is often required to conduct such an operation, the operability of the mobile device is impaired, thereby causing stress to the user.

In a conventional cellular phone including a geomagnetic sensor, a general procedure is as follows: A message to urge an execution of a correction process of the geomagnetic sensor is displayed on an LCD (Liquid Crystal Display) each time the geomagnetic sensor is activated or at regular intervals. A user sees the message and conducts a correction process.

In the case where a correction process is performed each time a geomagnetic sensor is activated, a user is required to conduct the aforementioned operation including rotation of the mobile device each time he/she uses the geomagnetic sensor. The user conducts the operation in response to the request, awaits completion of the correction process, and then obtains a measurement result of the geomagnetic sensor. However, such a procedure is likely to impair the operability and cause stress to the user.

In the case where a correction process is performed at regular intervals, sufficient accuracy can be obtained if the intervals are sufficiently shortened. However, a user is required to conduct frequent operations. If the intervals are lengthened, the measurement accuracy of the geomagnetic sensor is lowered while the frequency of the operation requests to the user is lowered. How to determine an appropriate length of the intervals becomes an issue. However, an appropriate length of the intervals depends upon the frequency at which the user moves and the like. Thus, it is difficult to determine an appropriate length of the intervals.

Furthermore, in either case, whether or not to perform a correction process depends upon the user. Some users may conduct no correction process or may rarely conduct a correction process. Constant reliability of the measurement results cannot be expected.

DISCLOSURE OF THE INVENTION

Problem(s) to be Solved by the Invention

The present invention has been made in view of those circumstances. A problem to be solved by the present invention is to provide a mobile device that performs a correction process of a geomagnetic sensor with sufficient frequency while it suppresses influence on the operability.

Means to Solve the Problem

In order to solve the above problem, one aspect of the present invention provides a correction method of a geomagnetic sensor in a mobile device, characterized by comprising: a step in which, in a mobile device having a geomagnetic sensor, position detection means for detecting a position of the mobile device, and a controller operable to control the geomagnetic sensor and the position detection means, the position detection means detects a predetermined position change; and a step in which the controller starts a correction process of the geomagnetic sensor based upon the detection.

Furthermore, another aspect of the present invention provides a mobile device characterized by comprising: a geomagnetic sensor, position detection means for detecting a position of the mobile device, and a controller operable to control the geomagnetic sensor and the position detection means, wherein the controller starts a correction process of the geomagnetic sensor when the position detection means detects a predetermined position change.

Moreover, still another aspect of the present invention provides a program executable in a controller of a mobile device having a geomagnetic sensor, position detection means for detecting a position of the mobile device, and the controller operable to control the geomagnetic sensor and the position detection means, characterized by allowing the controller to perform: a procedure of detecting a predetermined position change by the position detection means; and a procedure of starting a correction process of the geomagnetic sensor based upon the detection.

Effect(s) of the Invention

According to the present invention, even if a user does not consciously conduct an operation for a correction process, a correction process of a geomagnetic sensor is performed each time a predetermined position change occurs. Therefore, the user does not need to conduct a troublesome operation merely for a correction process, and a correction process required for an accurate measurement can be performed.

BEST MODE(S) FOR CARRYING OUT THE INVENTION

Figure 1:
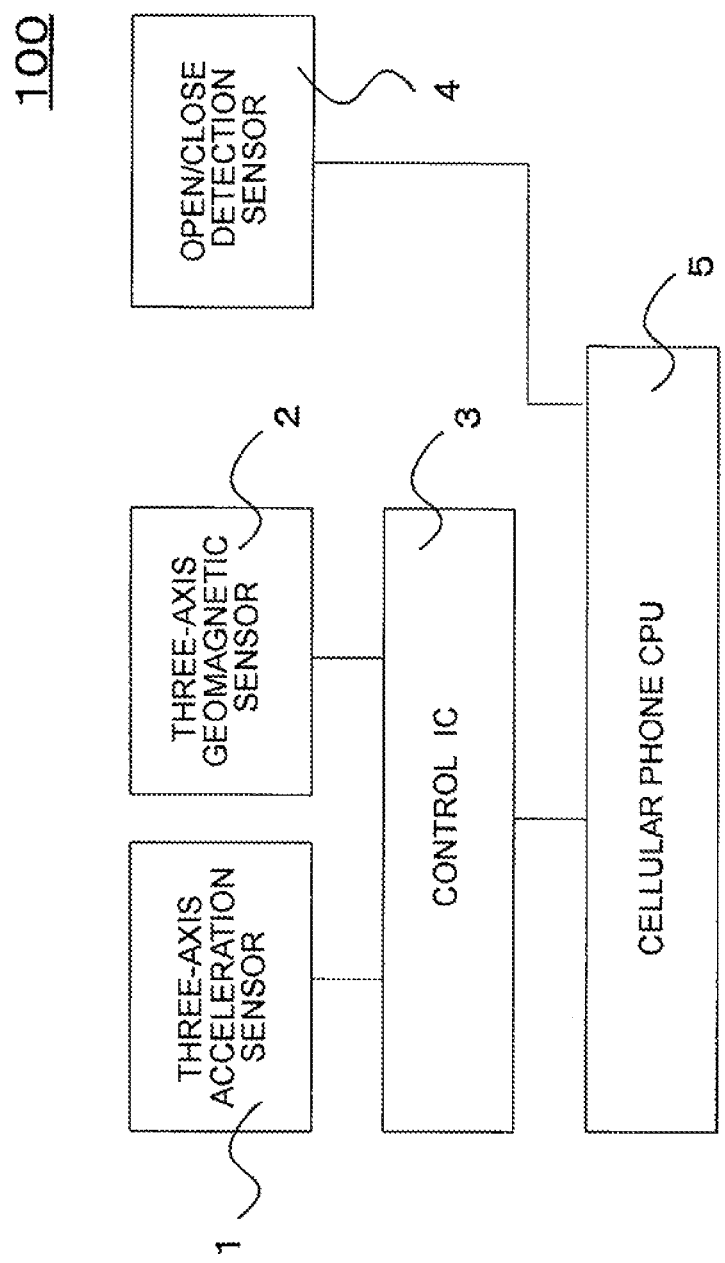
FIG. 1 is a block diagram of a cellular phone 100 according to an embodiment of the present invention.

Current mobile devices, particularly current cellular phones have expanded their functions. Many cellular phones assume that a direction in which a cellular phone is held is changed depending upon the function being used. For example, a straight type 1 seg TV compatible cellular phone assumes that the longitudinal direction of the cellular phone is raised substantially perpendicular to the ground when it is used for a telephone conversation, and that the transverse direction of the cellular phone is raised substantially perpendicular to the ground when it is used as a 1 seg TV receiver.

Furthermore, some mobile devices, particularly some cellular phones have a variety of transformation mechanisms so that they can be transformed to a plurality of forms. Specifically, there are a clamshell type, a biaxial type, a cycloid type, a double open type, a slide type, a straight type, and the like. As with the aforementioned way to hold, most of forms produced by those transformation mechanisms assume that mobile devices are transformed into and used in an appropriate form depending upon the function being used. For example, a biaxial cellular phone including a digital camera primarily assumes that a hinge is opened so that a screen of an LCD and a ten-key are located on the same side when it is used for a telephone conversation. The biaxial cellular phone including a digital camera also assumes that the hinge is closed after a rear face of the LCD and the ten-key are brought into the same side from the form used for the telephone conversation when it is used as a digital camera.

In this specification, a direction of a mobile device and a form of the mobile device are collectively referred to as a position of the mobile device. Each of a three-axis acceleration sensor for detecting a directional change of a mobile device and a sensor for detecting an open/close state of a hinge of a clamshell type cellular phone is referred to as position detection means. The present invention pays attention to the fact that a user conducts an operation of changing a position of a mobile device depending upon the function to be used. When a predetermined position change of a mobile device is detected by using an acceleration sensor or a sensor for detecting a transformation state such as opening/closing of a hinge, a correction process of a geomagnetic sensor is accordingly started and performed. Thus, a correction process of a magnetic sensor is performed while a user is unaware of it.

Particularly, if a correction process is performed based upon detection of a position change into the direction or form of a mobile device in which a geomagnetic sensor is used, then the correction process is started when a user conducts an operation of changing the direction or form of the mobile device to use the geomagnetic sensor. Therefore, the waiting time to complete the correction process can be minimized, and a highly accurate measurement can be performed with the geomagnetic sensor.

Figure 3:
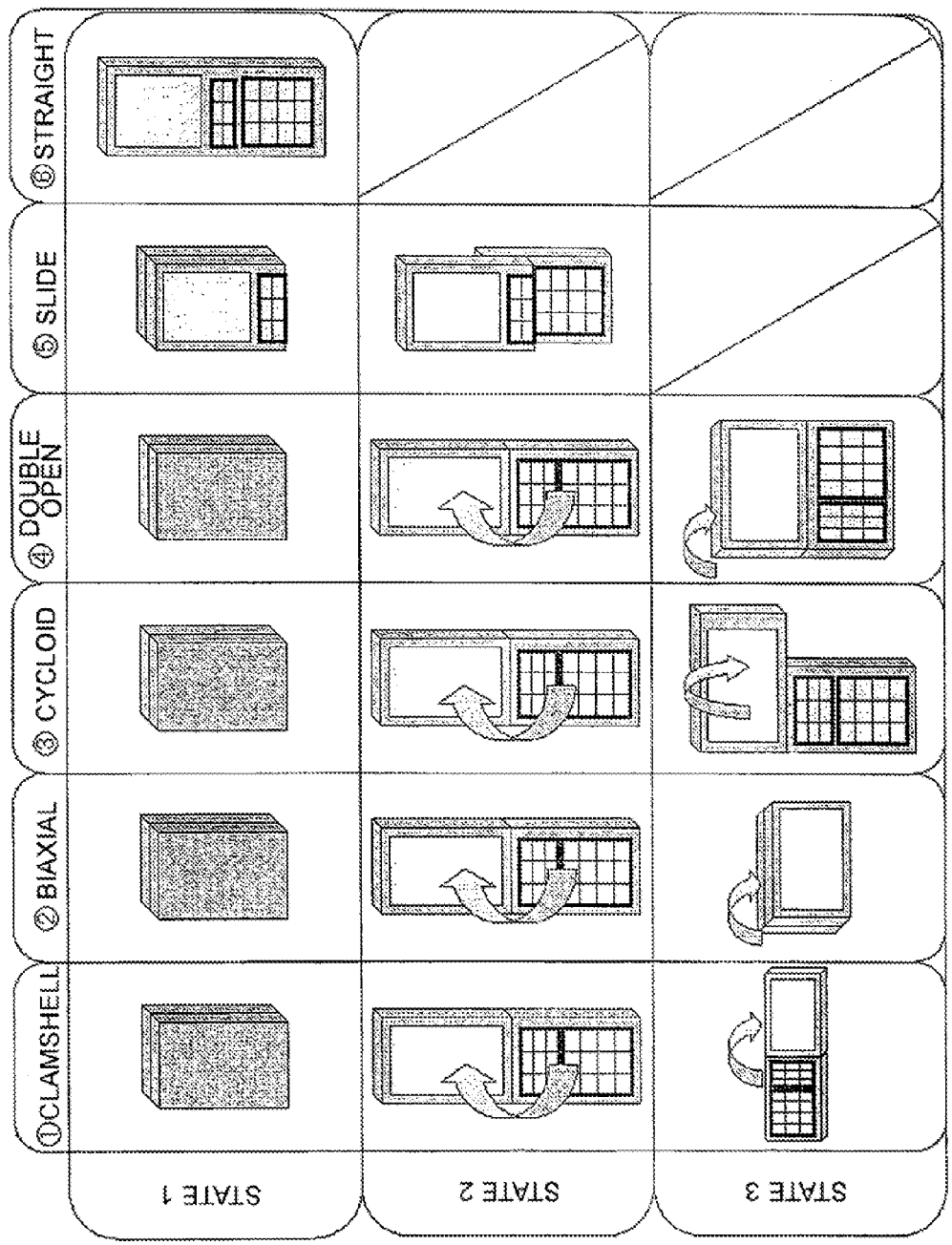
FIG. 3 is a diagram explanatory of types of transformation and directional changes of a cellular phone.

A cellular phone 100 according to an embodiment of the present invention will be described with reference to FIG. 1. The cellular phone 100 is a folding type cellular phone having an open/close mechanism as a transformation mechanism. Referring to FIG. 3, the cellular phone 100 is a cellular phone having a hinge that allows transformation involving an opening operation and a closing operation, specifically, such as a clamshell type, a biaxial type, a cycloid type, and a double open type. The cellular phone 100 has a three-axis acceleration sensor 1, a three-axis geomagnetic sensor 2, a control IC 3, an open/close state detection sensor 4, and a cellular phone CPU 5.

The three-axis acceleration sensor 1 and the three-axis geomagnetic sensor 2 are connected to the control IC 3 and controlled by the control IC 3. The three-axis acceleration sensor 1 and the three-axis geomagnetic sensor 2 output detected acceleration and geomagnetism.

The control IC 3 is controlled by the CPU 5. The control IC 3 performs a necessary arithmetic process on the acceleration and geomagnetism, which is inputted from the three-axis acceleration sensor 1 and the three-axis geomagnetic sensor 2, and outputs it to the CPU 5. Generally, in order to reduce electric power consumption, an interrupt signal is outputted from the control IC 3 to the CPU 5 only when a change required by the CPU 5 occurs.

The open/close state detection sensor 4 is connected to the CPU 5. The open/close state detection sensor 4 detects the open/close state of the hinge in the cellular phone 100 and notifies the CPU 5 of the detection with an interrupt.

The CPU 5 determines the direction of the cellular phone 100 and the form of an opened or closed state based upon the detection results of the three-axis acceleration sensor 1 and the open/close state detection sensor 4.

The CPU 5 is a processor for controlling an operation of the entire cellular phone 100 and has a storage device for storing various application programs operable in the cellular phone 100. Particularly, the CPU 5 stores therein a geomagnetic sensor use program that refers to the output of the three-axis geomagnetic sensor 2. For example, the geomagnetic sensor use program is an application for displaying a map or a navigation application. The geomagnetic sensor use program is executed in the CPU 5 in accordance with a certain operation of a user. The geomagnetic sensor use application is preset such that it is started with a landscape screen.

Figure 2:
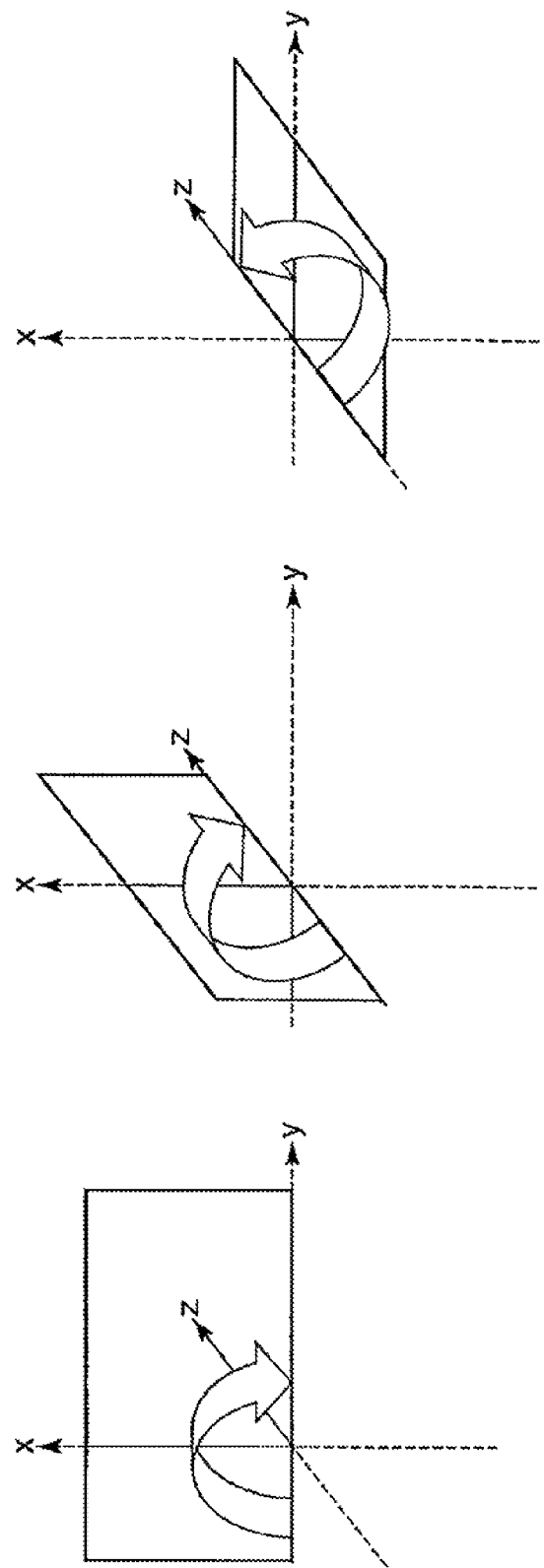
FIG. 2 is a diagram explanatory of a correction process of a three-axis geomagnetic sensor 2.

A correction process of the three-axis geomagnetic sensor 2 will be described with reference to FIG. 2. The longitudinal direction of the cellular phone 100 is defined as an X-axis, the transverse direction of the cellular phone 100 is defined as a Y-axis, and the thickness direction of the cellular phone 100 is defined as a Z-axis. It is necessary to detect the state (direction) of the geomagnetic sensor on two of the X-Y plane, the X-Z plane, and the Y-Z plane in the three dimensions of the X-direction, the Y-direction, and the Z-direction from the acceleration sensor, and compare it with a change of the geomagnetism to identify an accurate point of the compass. Particularly, when a cellular phone is used, the presence or direction of peripheral magnetic sources or the position of the device cannot be specified because a cellular phone has characteristics that it is carried and used by a general consumer. Therefore, in order to obtain more accurate measurement results, a correction process needs to be performed prior to the measurement with the geomagnetic sensor. As a correction is performed more frequently, a detection error can be reduced. However, a user has heretofore conducted a correction process in response to a notification from the portable terminal. Thus, a correction process has not been performed very frequently.

Next, an operation of the cellular phone 100 to perform a correction process of the three-axis geomagnetic sensor 2 will be described. As described above, the cellular phone 100 is a folding type cellular phone and has a structure in which an upper component having an LCD screen and a lower component having a ten-key are connected to each other by a hinge.

The three-axis acceleration sensor 1 and the three-axis geomagnetic sensor 2 are mounted on the upper component.

Prior to the operation of the cellular phone 100, the user holds and fixes the lower component in one hand, holds the upper component in the other hand, and rotates the upper component roughly a half-turn about the hinge from the front side toward the rear side so as to open the cellular phone 100. When the movement of the upper component at that time is detected by the three-axis acceleration sensor 1 and the open/close state detection sensor 4 (Step S1), the control IC 3 starts a correction process of the three-axis geomagnetic sensor 2 on the X-Z plane (Step S2). When the cellular phone 100 is opened, the three-axis geomagnetic sensor 2 included in the upper component makes a rotational movement around the hinge, i.e., the Y-axis, within the X-Z plane. The control IC 3 determines occurrence of the position change caused by this rotational movement based upon the outputs of the three-axis acceleration sensor 1 and the open/close state detection sensor 4. The control IC 3 uses the occurrence of the position change as a trigger for the correction process of the three-axis geomagnetic sensor 2 on the X-Z plane.

Then, when the three-axis acceleration sensor 1 detects that the position of the cellular phone 100 is changed such that the screen of the LCD is in landscape orientation (Step S3), the control IC 3 starts a correction process of the three-axis geomagnetic sensor 2 on the X-Y plane (Step S4).

As described above, the geomagnetic sensor use program is displayed in a direction in which the screen of the LCD is in landscape orientation during starting. Therefore, if the user is to execute the geomagnetic sensor use program, then he/she changes the direction of the cellular phone 100 so that he/she can see the landscape LCD in proper orientation after he/she has opened the upper component. At that time, the cellular phone 100 rotates about the Z-axis roughly through 90 degrees within the X-Y plane. The control IC 3 detects occurrence of the rotational movement on the X-Y plane based upon the outputs of the three-axis acceleration sensor 1 and the open/close state detection sensor 4. The control IC 3 uses the occurrence of the rotational movement as a trigger and starts a correction process of the three-axis geomagnetic sensor 2 on the X-Y plane.

The position change of the cellular phone 100 from Step S3 to S4 and the user's operation will be described in connection with each of the transformation mechanisms.

In the case of the clamshell type, the cellular phone itself is inclined into the horizontal position. This position change is detected by the three-axis acceleration sensor 1.

In the case of the biaxial type, the cellular phone itself is inclined into the horizontal position as with the clamshell type. Alternatively, the upper component is reversed such that its front side moves rearward, and then the upper component is closed. The position change caused by, the former operation is detected by the three-axis acceleration sensor 1. The position change caused by the latter operation is detected by the three-axis acceleration sensor 1 and the open/close state detection sensor 4. The upper component of the biaxial type has a hinge connecting the upper component and the lower component to each other and a rotation mechanism for rotating the upper component about an axis along the longitudinal direction. The biaxial type may have a sensor for detecting an operating state of this rotation mechanism independently of the open/close state detection sensor 4. The control IC 3 may determine the position of the cellular phone 100 with reference to the output of this sensor in addition to the outputs of the three-axis acceleration sensor 1 and the open/close state detection sensor 4. Use of the output from this sensor enables detection of a rotational movement of the upper component around the X-axis along the longitudinal direction, i.e., a rotational movement through about 180 degrees on the Y-Z plane. Thus, a correction process of the geomagnetic sensor on the Y-Z plane can be performed during the rotational movement.

In the case of the cycloid type, while the lower component is held as it is, only the upper component is rotated roughly through 90 degrees. This position change is detected by the three-axis acceleration sensor 1. The cellular phone 100 may further include a sensor for detecting an operating state of the cycloid mechanism and may determine the position with reference to the output from that sensor in addition to the output from the three-axis acceleration sensor 1.

In the case of the double open type cellular phone, there are two ways to open the upper component. Specifically, one is to open the upper component around an axis of a hinge provided on a shorter side of the lower component, and the other is to open the upper component around an axis of a hinge provided on a longer side of the lower component. Assuming that a cellular phone having a vertically-oriented longitudinal direction has been opened around the shorter side of the lower component, the user closes the upper component and then holds the cellular phone 100 again so that the hinge on the longer side of the lower component is located on an upper side of the cellular phone 100. The upper component is opened around the axis of the hinge provided on the longer side of the lower component. In the case of the double open type, the cellular phone 100 includes the hinge on the shorter side and the hinge on the longer side. An open/close state detection sensor is provided on each of those hinges. The control IC 3 determines the position of the cellular phone 100 in combination with the outputs from those open/close state detection sensors and the output from the three-axis acceleration sensor, triggering a correction of the geomagnetic sensor 2 on the X-Y plane. Instead of the above operation, for the double open type, a correction on the X-Y plane may be performed at the time when the upper component is brought into a horizontal state, and a correction on the X-Z plane may be performed when the upper component is opened around the hinge provided on the longer side of the lower component.

The operation from Steps S1 to S4 is not based upon the geomagnetic sensor use program. Thus, the user may start the geomagnetic sensor use program at any timing.

According to the cellular phone 100, the geomagnetic sensor use program does not display a message to urge an execution of a correction process on the LCD. The user does not see the message or conduct a predetermined operation for performing a correction process. When a predetermined position change is caused to the cellular phone 100 by user's changing the way to hold the cellular phone 100 or by user's transforming the cellular phone 100 with the transformation mechanism, that position change is detected based upon the output of the three-axis acceleration sensor or the sensor for detecting an operating state of the transformation mechanism. This detection is used as a trigger to start a correction process. Therefore, a correction process on the X-Z plane or the X-Y plane can be performed even though the user is unaware of the execution of the correction process. Thus, it is possible to avoid causing stress to the user.

Furthermore, a load on the user is so low that a frequency of performing a correction process can be increased. Therefore, it is possible to improve the accuracy of the output from the geomagnetic sensor. As a result, it is possible to enhance the accuracy of the operation of the geomagnetic sensor use program, which operates with reference to the output from the geomagnetic sensor.

Although the cellular phone 100 has been described above, the present invention is not limited to the above. It would be apparent to those skilled in the art that various modifications may be made therein without the technical scope of the present invention.

For example, in the foregoing description, the cellular phone 100 is a folding type cellular phone. A correction process of the geomagnetic sensor is started and performed at the time of a rotational movement around the axis of the hinge. However, the present invention is not limited to a folding type cellular phone. For example, in the case of the slide type cellular phone or the straight type cellular phone illustrated in FIG. 3, a position change from a state in which the cellular phone is placed on a table to a state in which the cellular phone is raised for use or a position change of inclining the cellular phone into a predetermined direction may be detected by using a three-axis acceleration sensor and used as a trigger to perform a correction process.

This application claims the benefit of priority from Japanese patent application No. 2009-117214, filed on May 14, 2009, the disclosure of which is incorporated herein in its entirety by reference.

The invention claimed is:

1. A correction method of a geomagnetic sensor in a mobile device, comprising:
   the mobile device having a geomagnetic sensor comprising a three-axis geomagnetic sensor, position detection means for detecting a position of the mobile device, and a controller operable to control the geomagnetic sensor and the position detection means, the position detection means includes an acceleration sensor that detects a predetermined position change; and
   the controller starts a correction process of the geomagnetic sensor based upon the detection;
   wherein the correction process includes:
   starting a correction process of the three-axis geomagnetic sensor on a first plane based upon detection of a first position change of part or all of the mobile device that includes a rotational movement on the first plane; and
   starting a correction process of the three-axis geomagnetic sensor on a second plane different from the first plane based upon detection of a rotational movement of part or all of the mobile device on the second plane.

2. The correction method of a geomagnetic sensor in a mobile device as recited in claim 1, wherein the mobile device has a structure in which a plurality of components are connected to each other by movable connection means, and the position detection means includes means for detecting a movable state of the connection means.

3. The correction method of a geomagnetic sensor in a mobile device as recited in claim 2, wherein the connection means includes at least one hinge that connects one of the plurality of components to other components so that the one of the plurality of components is rotatable with respect to the other components, and the position detection means detects an action of the hinge as the predetermined position change.

4. A mobile device comprising:
   a geomagnetic sensor comprising a three-axis geomagnetic sensor, position detection means including an acceleration sensor for detecting a position of the mobile device, and a controller operable to control the geomagnetic sensor and the position detection means,
   wherein the controller starts a correction process of the geomagnetic sensor when the position detection means detects a predetermined position change and the correction process includes:
   a correction process of the three-axis geomagnetic sensor on a first plane is started based upon detection of a first position change of part or all of the mobile device that includes a rotational movement on the first plane; and
   a correction process of the three-axis geomagnetic sensor on a second plane different from the first plane is started based upon detection of a rotational movement of part or all of the mobile device on the second plane.

5. The mobile device as recited in claim 4, wherein the mobile device has a structure in which a plurality of components are connected to each other by movable connection means, and the position detection means includes means for detecting a movable state of the connection means.

6. The mobile device as recited in claim 5, wherein the connection means includes at least one hinge that connects one of the plurality of components to other components so that the one of the plurality of components is rotatable with respect to the other components, and the position detection means detects an action of the hinge as the predetermined position change.

7. A non-transitory computer readable medium storing a program executable in a controller of a mobile device having a geomagnetic sensor comprising a three-axis geomagnetic sensor, position detection means including an acceleration sensor for detecting a position of the mobile device, and the controller operable to control the geomagnetic sensor and the position detection means, characterized by allowing the controller to perform:
   a procedure of detecting a predetermined position change by the position detection means; and
   a procedure of starting a correction process of the geomagnetic sensor based upon the detection;
   wherein the procedure of stating the correction process includes:
   a procedure of starting a correction process of the three-axis geomagnetic sensor on a first plane based upon detection of a first position change of part or all of the mobile device that includes a rotational movement on the first plane; and
   a procedure of starting a correction process of the three-axis geomagnetic sensor on a second plane different from the first plane based upon detection of a rotational movement of part or all of the mobile device on the second plane.

8. The non-transitory computer readable medium storing the program as recited in claim 7, wherein the mobile device has a structure in which a plurality of components are connected to each other by movable connection means, and the position detection means includes means for detecting a movable state of the connection means.

9. The non-transitory computer readable medium storing the program as recited in claim 8, wherein the connection means includes at least one hinge that connects one of the plurality of components to other components so that the one of the plurality of components is rotatable with respect to the other components, and the position detection means detects an action of the hinge as the predetermined position change.

* * * * *